(12) United States Patent
Chou et al.

(10) Patent No.: US 11,871,510 B2
(45) Date of Patent: Jan. 9, 2024

(54) CIRCUIT BOARD HAVING COMPLEMENTARY SIGNAL CONDUCTING PATTERNS

(71) Applicant: HONG FU JIN PRECISION INDUSTRY (WuHan) CO., LTD., Wuhan (CN)

(72) Inventors: Hou-Yuan Chou, New Taipei (TW); Yi-Chih Wu, New Taipei (TW); Feng-Hua Deng, Wuhan (CN); Ming-Fang Chen, Wuhan (CN)

(73) Assignee: HONG FU JIN PRECISION INDUSTRY (WuHan) CO., LTD., Wuhan (CN)

( * ) Notice: Subject to any disclaimer, the term of this patent is extended or adjusted under 35 U.S.C. 154(b) by 582 days.

(21) Appl. No.: 17/050,848

(22) PCT Filed: Sep. 14, 2020

(86) PCT No.: PCT/CN2020/115134
§ 371 (c)(1),
(2) Date: Oct. 27, 2020

(87) PCT Pub. No.: WO2022/052121
PCT Pub. Date: Mar. 17, 2022

(65) Prior Publication Data
US 2023/0164909 A1     May 25, 2023

(51) Int. Cl.
*H05K 1/02*     (2006.01)
*H05K 3/10*     (2006.01)

(52) U.S. Cl.
CPC ............. *H05K 1/0251* (2013.01); *H05K 3/10* (2013.01); *H05K 2201/09236* (2013.01)

(58) Field of Classification Search
CPC ...... H05K 1/0245; H05K 1/0251; H05K 1/02; H05K 3/10; H05K 2201/09236; H05K 2201/09636; H05K 2201/09718; H05K 1/0228; H05K 1/113; H05K 1/114; H05K 1/144; H05K 1/181; H05K 3/0047; H05K 3/4007; H05K 3/42; H05K 3/429; H05K 2201/0187; H05K 2201/041;
(Continued)

(56) References Cited

U.S. PATENT DOCUMENTS

2002/0179332 A1* 12/2002 Uematsu ................ H05K 1/115
174/262
2010/0065321 A1* 3/2010 Kashiwakura ......... H05K 1/116
29/846
(Continued)

FOREIGN PATENT DOCUMENTS

EP     1147905     10/2001

OTHER PUBLICATIONS

U.S. Appl. No. 62/852,285, filed May 2019, Kim; Hyunju.*

*Primary Examiner* — Timothy J Thompson
*Assistant Examiner* — Guillermo J Egoavil
(74) *Attorney, Agent, or Firm* — ScienBiziP, P.C.

(57) ABSTRACT

A conductive pattern has been disclosed. The conductive pattern includes a pair of conductive traces. Each of the conductive traces comprises a linear portion and a terminal portion. The terminal portions are arranged adjacent to each other and comprises a pair of circular arc profile with a pair of complementary notches facing toward each other.

19 Claims, 11 Drawing Sheets

(58) Field of Classification Search
CPC ... H05K 2201/094; H05K 2201/09418; H05K 2201/09854
USPC .......................................... 174/262; 361/767
See application file for complete search history.

(56) References Cited

U.S. PATENT DOCUMENTS

| | | | |
|---|---|---|---|
| 2015/0107888 A1* | 4/2015 | Uemichi | H05K 1/0245 |
| | | | 174/262 |
| 2020/0375024 A1* | 11/2020 | Kim | H05K 3/4007 |

* cited by examiner

CIRCUIT BOARD HAVING COMPLEMENTARY SIGNAL CONDUCTING PATTERNS

BACKGROUND

1. Field

The present disclosure generally relates to a conductive pattern, and more particularly, a conductive pattern having a pair of terminal portions having a pair of circular arc profile with a pair of complementary notches.

2. Related Art

High frequency signals transmitted through transmission lines may suffer from insertion losses. The magnitude of the insertion loss depends on the signal frequency, the transmission line geometry, and the material properties of the signal carrying medium. Further, transmission lines arranged close to each other may exhibit signal cross talk. Thus, the provision of improved transmission structure for high frequency signals is desired.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

DETAILED DESCRIPTION

Figure 1:
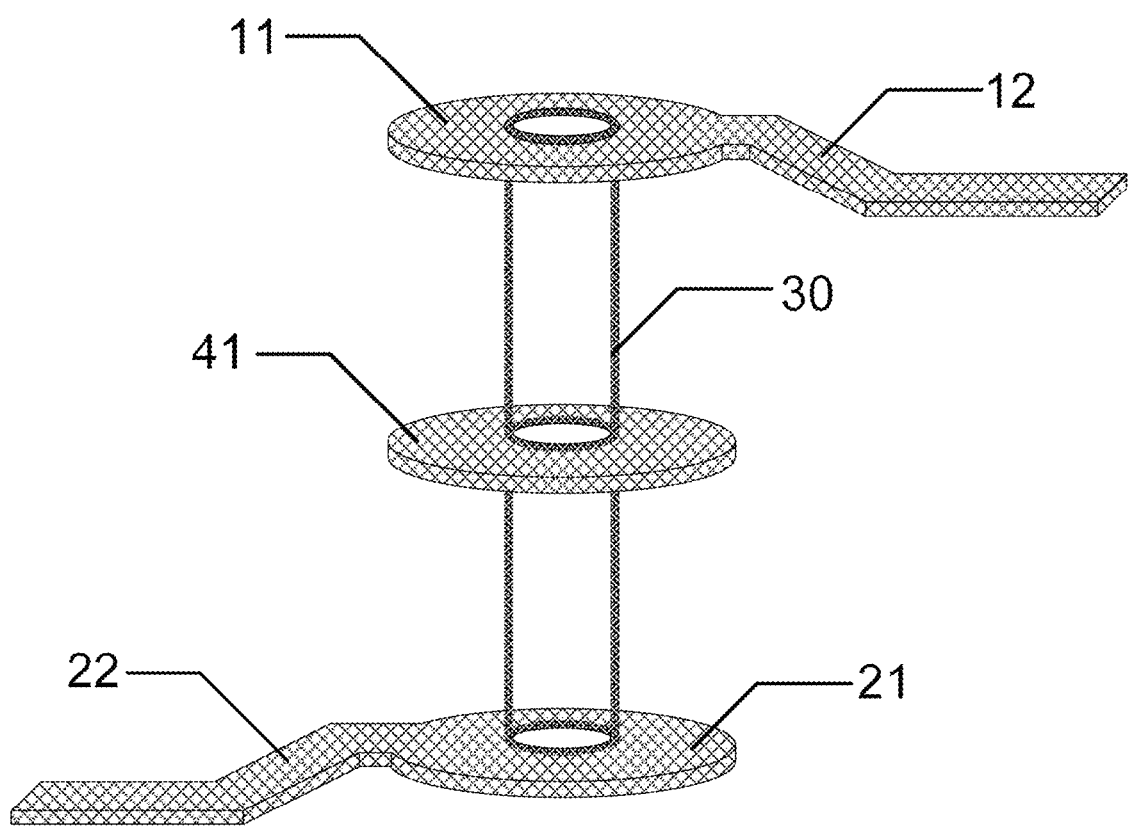
FIG. 1 illustrates a 3D representation view of an inter-surface junction of a substrate according to some embodiments of the instant disclosure.

The present disclosure will now be described more fully hereinafter with reference to the accompanying drawings, in which exemplary embodiments of the disclosure are shown. This disclosure may, however, be embodied in many different forms and should not be construed as limited to the exemplary embodiments set forth herein. Rather, these exemplary embodiments are provided so that this disclosure will be thorough and complete, and will fully convey the scope of the disclosure to those skilled in the art. Like reference numerals refer to like elements throughout.

The terminology used herein is for the purpose of describing particular exemplary embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," or "includes" and/or "including" or "has" and/or "having" when used herein, specify the presence of stated features, regions, integers, steps, operations, elements, and/or components, but do not preclude the presence or addition of one or more other features, regions, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

FIG. 1 illustrates a 3D representation view of an inter-surface junction of a substrate according to some embodiments of the instant disclosure. In some embodiments, the inter-surface junction is formed within a substrate. In some embodiments, the substrate comprises a generally planar structure that provides mechanical support for a plurality layers of conductive traces (e.g., circuit/interconnecting components). In some embodiments, the substrate can be a printed circuit board (PCB) such as Single-layer PCBs, Double-layer PCBs, Multi-layer PCBs, Rigid PCBs, Flexible PCBs, Rigid-Flex PCBs, High-frequency PCBs, Aluminum-backed PCBs.

The inter-surface junction allows electrical connection between the conductive paths on the first surface and the conductive paths on second surface of the substrate. In some embodiments, the inter-surface junction includes a first conductive trace, a second conductive trace, and a conductive via 30. The first conductive trace formed on the first surface includes a linear portion 12 and a terminal portion 11. The second conductive trace formed on the second surface includes a linear portion 22 and a terminal portion 21. The conductive via 30 penetrates through the central area of the terminal portions 11, 21 of the first conductive trace and the second conductive trace. In this way, the conductive via 30 may electrically connect the first conductive trace and the second conductive trace.

In some other embodiments, a third conductive trace having a terminal portion 41 is disposed in a level between the first conductive trace and the second conductive trace (e.g., in a middle layer of a multilayered, stacked laminate structure). In some embodiments, the conductive via 30 penetrates through the central area of the terminal portion 41 of the third conductive trace. In this way, the third conductive trace may be electrically connected to the first conductive trace and the second conductive trace.

In some embodiments, conductive via 30 is formed by forming a through hole through the central area of the terminal portions 11, 21 of the first conductive trace and the second conductive trace. Subsequently, a conductive material may be plated onto the sidewall surface exposed by the through holes. The terminal portions 11, 21 of the first conductive trace and the second conductive trace are electrically coupled through the conductive plating in the through hole. In some embodiments, the through hole of the conductive via 30 may be further filled with fillings such as dielectric material or conductive material.

Figure 2:
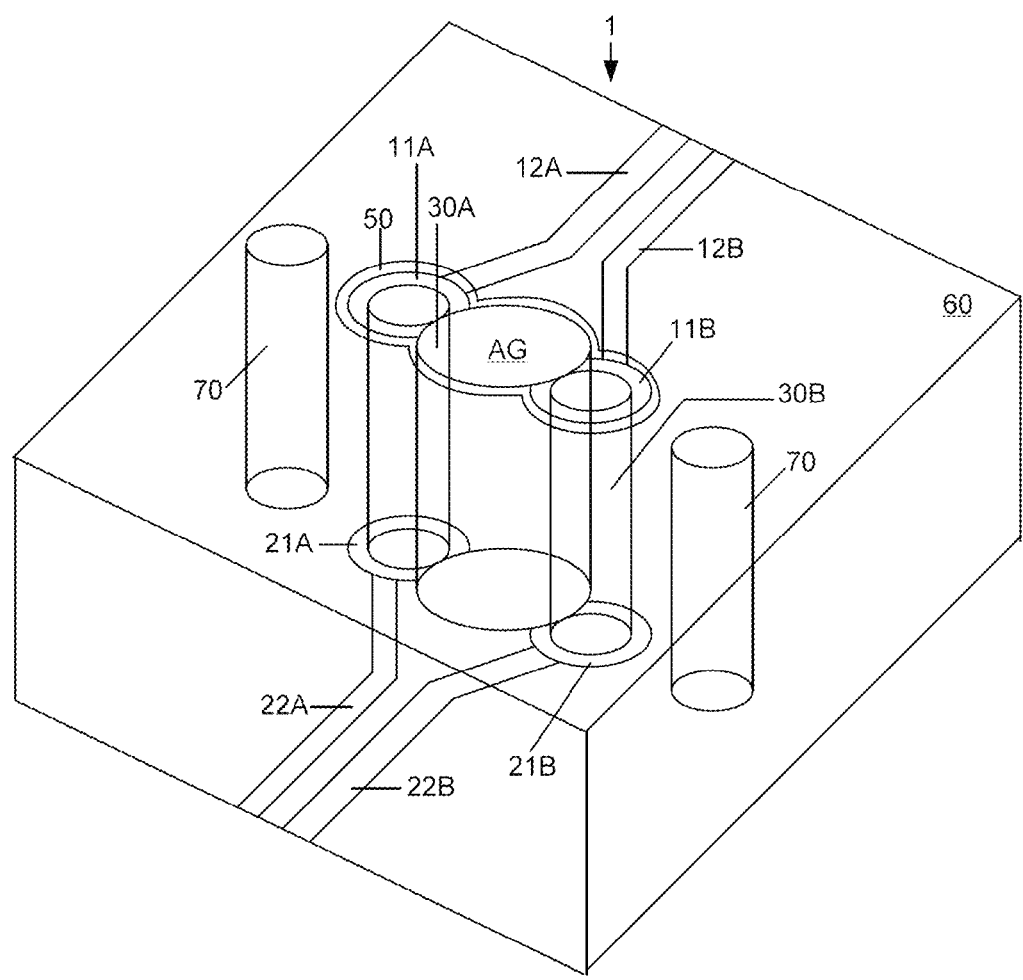
FIG. 2 illustrates a 3D representation view of a substrate according to some embodiments of the instant disclosure.

When two of the inter-surface junctions such as shown in FIG. 1 are placed in close vicinity of each other, problems may occur during device operation. FIG. 2 illustrates a 3D representation view of a substrate according to some embodiments of the instant disclosure. In some embodiments, an inter-surface junction having two signal paths is formed within the substrate 1. The substrate 1 have a first surface and a second surface opposite the first surface. In some embodiments, the inter-surface junction includes a pair of conductive vias 30A and 30B adjacent to each other and a gap AG (i.e. air gap) formed between the pair of conductive vias 30A and 30B. The gap AG is configured to enable access between the first surface and the second surface. The absence of material in the gap AG helps to reduce the overall dielectric constant at the trace terminal/vias region, thus alleviating parasitic capacitance that may lead to undesirable problems such as signal delay and crosstalk. It is to be noted that, the term "air gap" generally refers to the absence of material filling in a particular region (thereby forming a structure with void), and does not necessarily imply the gaseous content therein.

In some embodiments, the gap AG defines a substantially elliptical air gap. In some other embodiments, the gap AG defines a substantially circular air gap. In some embodiments, the conductive vias 30A and 30B enables signal communication between the first surface and the second surface of the substrate 1.

In some embodiments, a pair of first complementary conductive traces formed on the first surface are correspondingly coupled to the conductive vias 30A and 30B. In some embodiments, the conductive vias 30A and 30B are tubular structures having a conductive sidewall and a channel in the central area surrounded by the sidewall. In some embodiments, the central area has no filling. In some other embodiments, the central area has fillings including at least one of conductive material and dielectric material. Each of the first complementary conductive traces correspondingly includes a linear portion 12A, 12B and a terminal portion 11A, 11B. The linear portions 12A and 12B extend linearly abreast each other. The terminal portions 11A and 11B are arranged adjacent to each other. The terminal portions 11A and 11B each have a circular arc profile. The circular arc profile can be curved profile resembling a part of the circumference of a circle. Further, the terminal portions 11A and 11B have a pair of complementary notches facing towards each other. In some embodiments, the pair of complementary notches conforms to the profile of the gap AG. The complementary notches of the terminal portions 11A and 11B are substantially mirror symmetrical. In some embodiments, the gap AG exposes the conductive vias 30A and 30B at the complementary notches of the terminal portions 11A and 11B.

In some embodiments, a pair of second complementary conductive traces formed on the second surface are correspondingly coupled to the conductive vias 30A and 30B. Each of the second complementary conductive traces correspondingly includes a linear portion 22A, 22B and a terminal portion 21A, 21B. The linear portions 22A and 22B extend linearly abreast each other. The terminal portions 21A and 21B are arranged adjacent to each other. The terminal portions 21A and 21B each have a circular arc profile. Further, the terminal portions 21A and 21B have a pair of complementary notches facing towards each other. The complementary notches of the terminal portions 21A and 21B are substantially mirror symmetrical. In some embodiments, the gap AG exposes the conductive vias 30A and 30B at the complementary notches of the terminal portions 21A and 21B.

In some embodiments, the terminal portions 11A is electrically coupled to the terminal portions 21A through the conductive via 30A. In some embodiments, the terminal portions 11B is electrically coupled to the terminal portions 21B through the conductive via 30B.

In some embodiments, the inter-surface junction is formed between a pair of power junctions 70. In some embodiments, the power junctions 70 may include at least one of a power supply via or a ground via.

In some embodiments, the substrate 1 further includes a solder mask material 60 disposed on at least one surface of the substrate 1. The solder mask layer 60 exposes at least a portion of the conductive traces. In an exemplary embodiment of FIG. 2, the terminal portions 11A and 11B are exposed through the solder mask layer 60.

Further, the solder mask layer 60 exposes a dielectric region 50 of the substrate 1. In some embodiments, the dielectric region 50 have a rounded annular profile. A portion of the annular profile conforms to the profile of the terminal portions 11A and 11B. Further, another portion of the annular profile conforms to the profile of the gap between the complementary notches of the terminal portions 11A and 11B.

Figure 3:
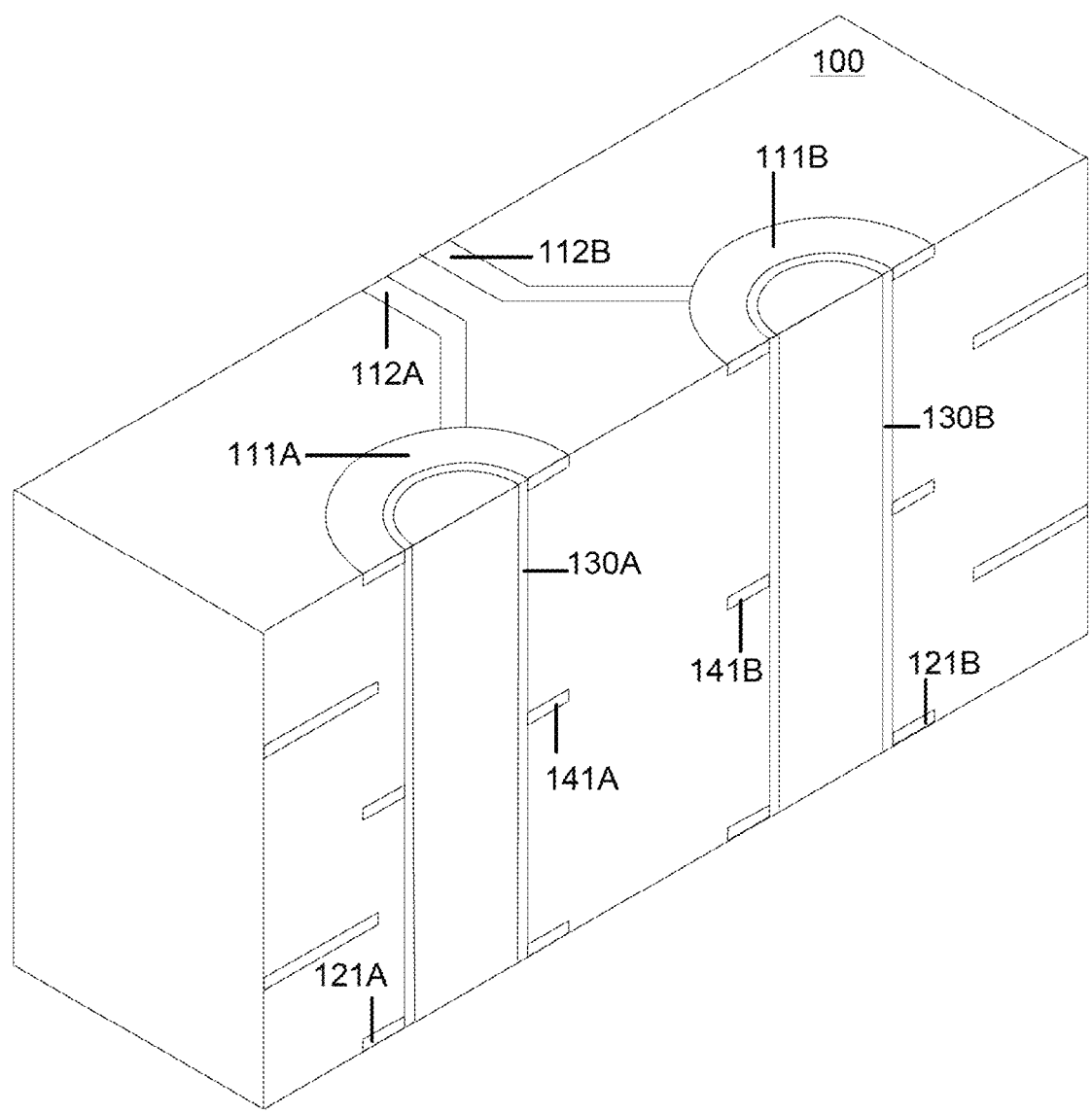
FIG. 3 illustrates a cross sectional view of an inter-surface junction of a substrate according to some embodiments of the instant disclosure.

FIG. 3 illustrates a cross sectional view of an inter-surface junction of a substrate according to some embodiments of the instant disclosure. The inter-surface junction disposed in a substrate 100 comprises a pair of conductive vias 130A and 130B arranged adjacent to each other, a pair of terminal portions 111A and 111B formed on the first surface of the substrate 100 and correspondingly coupled to the conductive vias 130A and 130B, a pair of linear portions 112A and 112B correspondingly coupled to the terminal portions 111A and 111B, and a pair of terminal portions 121A and 121B formed on the second surface of the substrate 100 and correspondingly coupled to the conductive vias 130A and 130B.

In some embodiments, the inter-surface junction further comprises a pair of terminal portions 141A and 141B formed between the first surface and the second surface of the substrate 100 and correspondingly coupled to the conductive vias 130A and 130B.

In some embodiments, the terminal portions 111A, 111B, 121A and 121B correspondingly have an annular profile (i.e. circular profile). Further, terminal portions 141A and 141B correspondingly have an annular profile (i.e. circular profile). In some embodiments the terminal portions 111A and 121A electrically coupled to the conductive via 130A projectively overlap each other. In some embodiments the terminal portions 111B and 121B electrically coupled to the conductive via 130B projectively overlap each other.

In some other embodiments the terminal portion 141A electrically coupled to the conductive via 130A is projectively overlapping with the terminal portions 111A and 121A. In some other embodiments the terminal portion 141B electrically coupled to the conductive via 130B is projectively overlapping with the terminal portions 111B and 121B.

In some embodiments, the substrate 100 comprises dielectric material (e.g., glass-reinforced epoxy laminate material such as FR4). The conductive vias 130A and 130B and the terminal portions 111A, 111B, 121A and 121B are surrounded by the dielectric material. During operation, the dielectric material between the conductive vias 130A and 130B may cause insertion loss causing a slower propagation speed.

Figure 4:
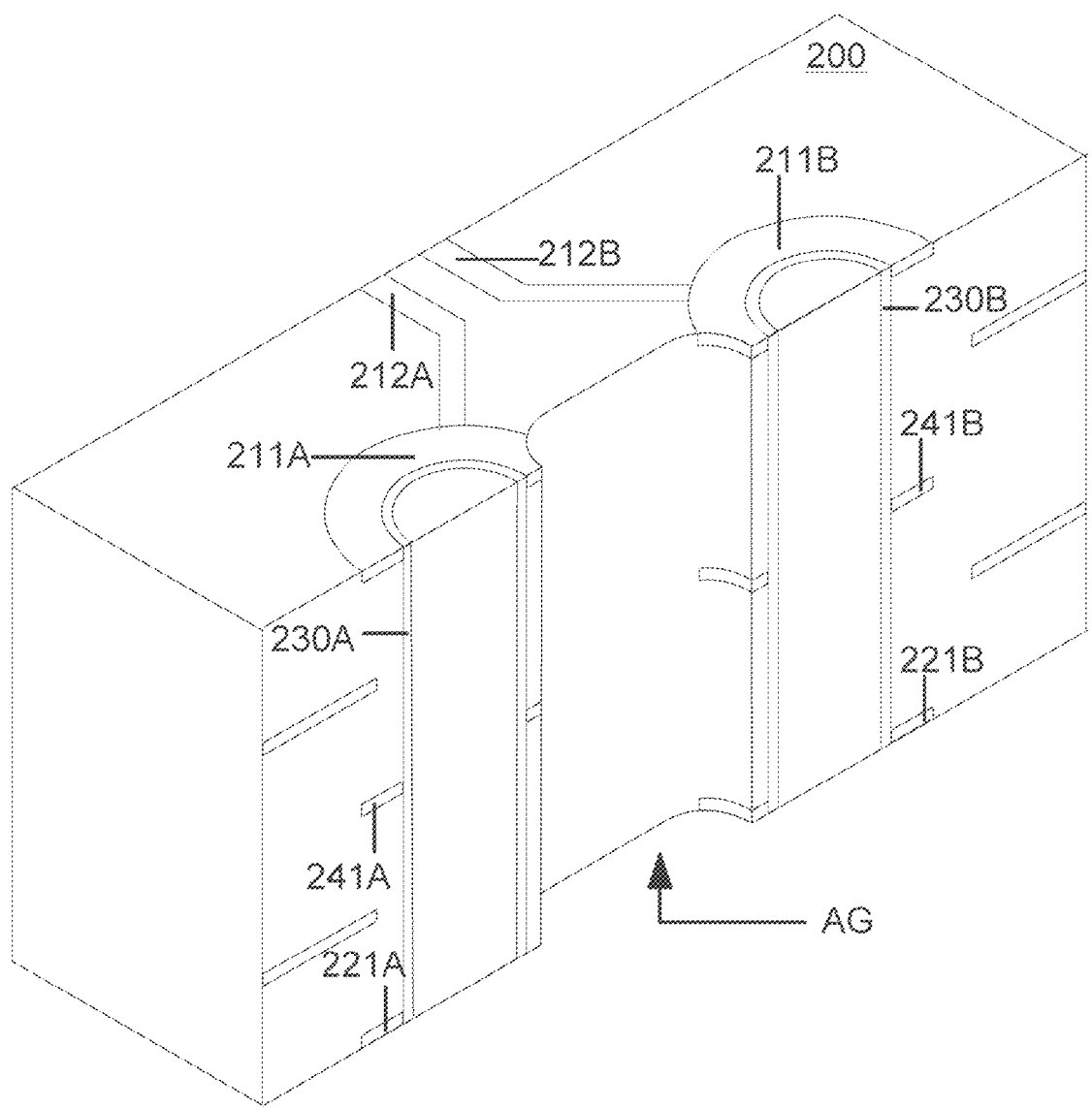
FIG. 4 illustrates a cross sectional view of an inter-surface junction of a substrate according to some embodiments of the instant disclosure.

FIG. 4 illustrates a cross sectional view of an inter-surface junction of a substrate according to some embodiments of the instant disclosure. The inter-surface junction disposed in a substrate 200 comprises a pair of conductive vias 230A and 230B arranged adjacent to each other, a pair of terminal portions 211A and 211B formed on the first surface of the substrate 200 and correspondingly coupled to the conductive vias 230A and 230B, a pair of linear portions 212A and 212B correspondingly coupled to the terminal portions 211A and 211B, and a pair of terminal portions 221A and 221B formed on the second surface of the substrate 200 and correspondingly coupled to the conductive vias 230A and 230B.

In some embodiments, the inter-surface junction further comprises a pair of terminal portions 241A and 241B formed between the first surface and the second surface of the substrate 200 and correspondingly coupled to the conductive vias 230A and 230B.

In some embodiments, the terminal portions 211A, 211B, 221A and 221B correspondingly have an annular profile (i.e. circular profile). Further, terminal portions 241A and 241B correspondingly have an annular profile (i.e. circular profile). In some embodiments the terminal portions 211A and 221A electrically coupled to the conductive via 230A projectively overlap each other. In some embodiments the terminal portions 211B and 221B electrically coupled to the conductive via 230B projectively overlap each other.

In some other embodiments the terminal portion 241A electrically coupled to the conductive via 230A is projectively overlapping with the terminal portions 211A and 221A. In some other embodiments the terminal portion 241B electrically coupled to the conductive via 230B is projectively overlapping with the terminal portions 211B and 221B.

In some embodiments, the substrate 200 comprises dielectric material (i.e. glass-reinforced epoxy laminate material such as FR4). The conductive vias 230A and 230B and the terminal portions 211A, 211B, 221A and 221B are surrounded by the dielectric material.

In some embodiments, a portion of the dielectric material between the conductive vias 230A and 230B is removed. In this way, a pair of complementary notches are formed on the pair of terminal portions 211A and 211B. In some embodiments, the complementary notches are mirror symmetrical to each other.

In some embodiments, a portion of the dielectric material between the conductive vias 230A and 230B is removed. In this way, a pair of complementary notches are formed on the pair of terminal portions 221A and 221B. In some embodiments, the complementary notches are mirror symmetrical to each other.

Although there is a layer of dielectric material between the conductive vias 230A and 230B, a gap AG between the conductive vias 230A and 230B is formed. The gap AG may be an air gap having a relative dielectric constant of 1. In some embodiments, the wall within the air gap is not coated with any material. Thus, during operation, the gap AG may lower insertion loss causing a higher propagation speed.

Figure 5:
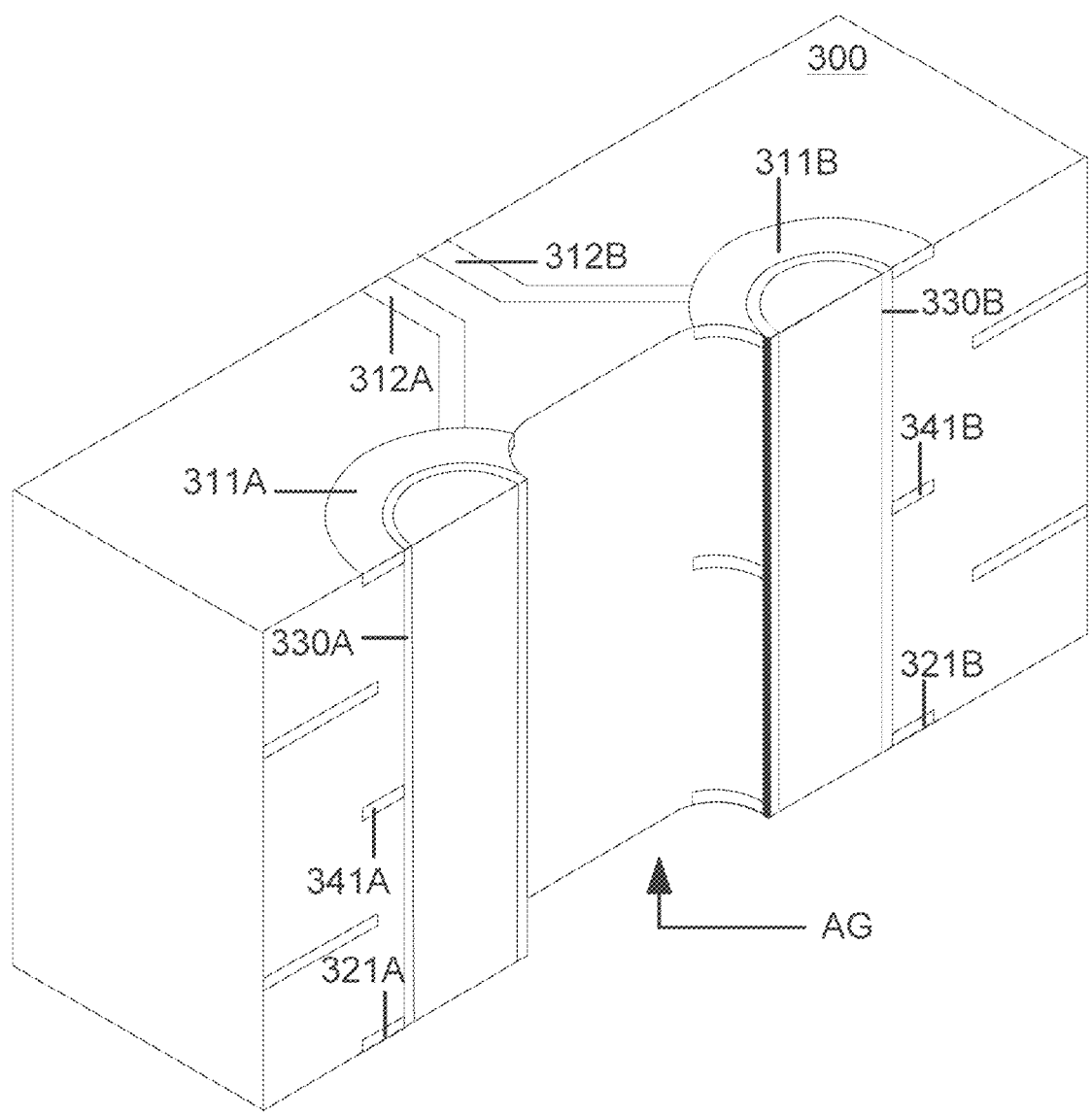
FIG. 5 illustrates a cross sectional view of an inter-surface junction of a substrate according to some embodiments of the instant disclosure.

FIG. 5 illustrates a cross sectional view of an inter-surface junction of a substrate according to some embodiments of the instant disclosure. The inter-surface junction disposed in a substrate 300 comprises a pair of conductive vias 330A and 330B arranged adjacent to each other, a pair of terminal portions 311A and 311B formed on the first surface of the substrate 300 and correspondingly coupled to the conductive vias 230A and 330B, a pair of linear portions 312A and 312B correspondingly coupled to the terminal portions 311A and 311B, and a pair of terminal portions 321A and 321B formed on the second surface of the substrate 300 and correspondingly coupled to the conductive vias 330A and 330B.

In some embodiments, the inter-surface junction further comprises a pair of terminal portions 341A and 341B formed between the first surface and the second surface of the substrate 300 and correspondingly coupled to the conductive vias 330A and 330B.

In some embodiments, the terminal portions 311A, 311B, 321A and 321B correspondingly have an annular profile (i.e. circular profile). Further, terminal portions 341A and 341B correspondingly have an annular profile (i.e. circular profile). In some embodiments the terminal portions 311A and 321A electrically coupled to the conductive via 330A projectively overlap each other. In some embodiments the terminal portions 311B and 321B electrically coupled to the conductive via 330B projectively overlap each other.

In some other embodiments the terminal portion 341A electrically coupled to the conductive via 330A is projectively overlapping with the terminal portions 311A and 321A. In some other embodiments the terminal portion 341B electrically coupled to the conductive via 330B is projectively overlapping with the terminal portions 311B and 321B.

In some embodiments, the substrate 300 comprises dielectric material (i.e. glass-reinforced epoxy laminate material such as FR4). The conductive vias 330A and 330B and the terminal portions 311A, 311B, 321A and 321B are surrounded by the dielectric material.

In some embodiments, a portion of the dielectric material between the conductive vias 330A and 330B is removed. In this way, a pair of complementary notches are formed on the pair of terminal portions 311A and 311B. In some embodiments, the complementary notches are mirror symmetrical to each other.

In some embodiments, a portion of the dielectric material between the conductive vias 330A and 330B is removed. In this way, a pair of complementary notches are formed on the pair of terminal portions 321A and 321B. In some embodiments, the complementary notches are mirror symmetrical to each other.

A gap AG between the conductive vias 330A and 330B is formed. A portion of the conductive vias 330A and 330B are exposed in the gap AG. The gap AG may be an air gap having a relative dielectric constant of 1. In some embodiments, the wall within the air gap is not coated with any material. Thus, during operation, the gap AG may lower insertion loss causing a higher propagation speed.

Figure 6:
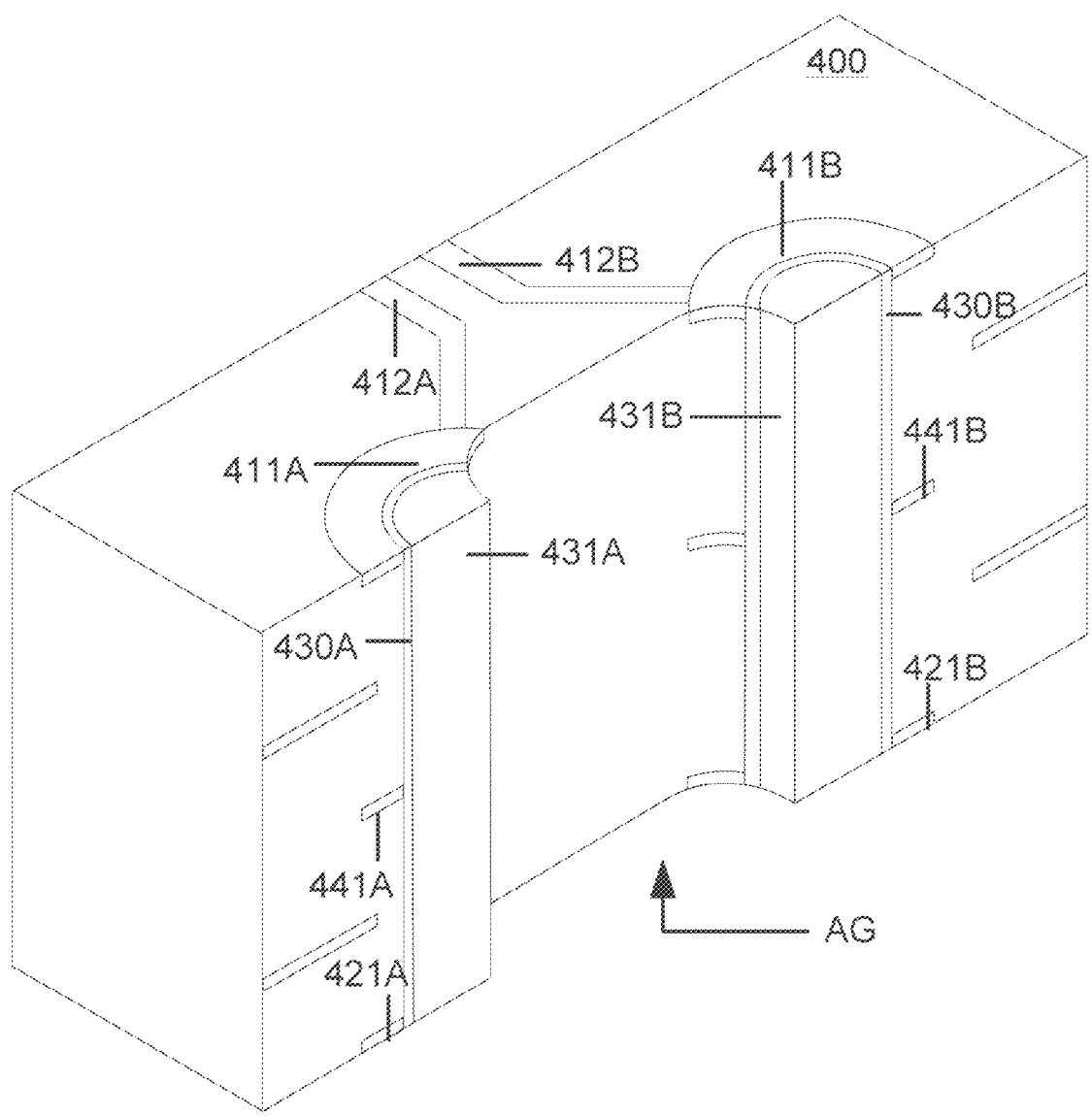
FIG. 6 illustrates a cross sectional view of an inter-surface junction of a substrate according to some embodiments of the instant disclosure.

FIG. 6 illustrates a cross sectional view of an inter-surface junction of a substrate according to some embodiments of the instant disclosure. The inter-surface junction disposed in a substrate 400 comprises a pair of conductive vias 430A and 430B arranged adjacent to each other, a pair of terminal portions 411A and 411B formed on the first surface of the substrate 400 and correspondingly coupled to the conductive vias 430A and 430B, a pair of linear portions 412A and 412B correspondingly coupled to the terminal portions 411A and 411B, and a pair of terminal portions 421A and 421B formed on the second surface of the substrate 400 and correspondingly coupled to the conductive vias 430A and 430B.

In some embodiments, the inter-surface junction further comprises a pair of terminal portions 441A and 441B formed between the first surface and the second surface of the substrate 400 and correspondingly coupled to the conductive vias 430A and 430B.

In some embodiments, the terminal portions 411A, 411B, 421A and 421B correspondingly have an annular profile (i.e. circular profile). Further, terminal portions 441A and 441B correspondingly have an annular profile (i.e. circular profile). In some embodiments the terminal portions 411A and 421A electrically coupled to the conductive via 430A projectively overlap each other. In some embodiments the terminal portions 411B and 421B electrically coupled to the conductive via 430B projectively overlap each other.

In some other embodiments the terminal portion 441A electrically coupled to the conductive via 430A is projectively overlapping with the terminal portions 411A and 421A. In some other embodiments the terminal portion 441B electrically coupled to the conductive via 330B is projectively overlapping with the terminal portions 411B and 421B.

In some embodiments, the substrate 400 comprises dielectric material (i.e. glass-reinforced epoxy laminate material such as FR4). The conductive vias 430A and 430B and the terminal portions 411A, 411B, 421A and 421B are surrounded by the dielectric material.

In some embodiments, a portion of the dielectric material between the conductive vias 430A and 430B is removed. In this way, a pair of complementary notches are formed on the pair of terminal portions 411A and 411B. The terminal portions 411A and 411B is formed to have circular arc profile. In some embodiments, the complementary notches are mirror symmetrical to each other.

In some embodiments, a portion of the dielectric material between the conductive vias 430A and 430B is removed. In this way, a pair of complementary notches are formed on the pair of terminal portions 421A and 421B. The terminal portions 421A and 421B is formed to have circular arc profile. In some embodiments, the complementary notches are mirror symmetrical to each other.

A gap AG between the conductive vias 430A and 430B is formed. A portion of the conductive vias 430A and 430B are exposed in the gap AG. Further, a portion of the conductive vias 430A and 430B are removed during forming of the gap AG. In some embodiments, to preserve the structural integrity of the conductive vias 430A and 430B, the conductive vias 430A and 430B may be a solid structure of conductive material. In some other embodiments, the structural integrity of the conductive vias 430A and 430B are strong enough such that no filling is required in the central area of the conductive vias 430A and 430B to support the formation of the gap AG.

In some other embodiments, the conductive vias 430A and 430B includes a conductive material plating formed within a through holes correspondingly penetrating the central areas of the terminal portions 411A, 411B, 421A and 421B. And, a filling 431A and 431B such a dielectric material or conductive epoxy may disposed within the central area of the through holes to support the conductive material plating and prevent peeling during formation of the gap AG.

The gap AG may be an air gap having a relative dielectric constant of 1. In some embodiments, the wall within the air gap is not coated with any material. Thus, during operation, the gap AG may lower insertion loss causing a higher propagation speed.

Figure 7:
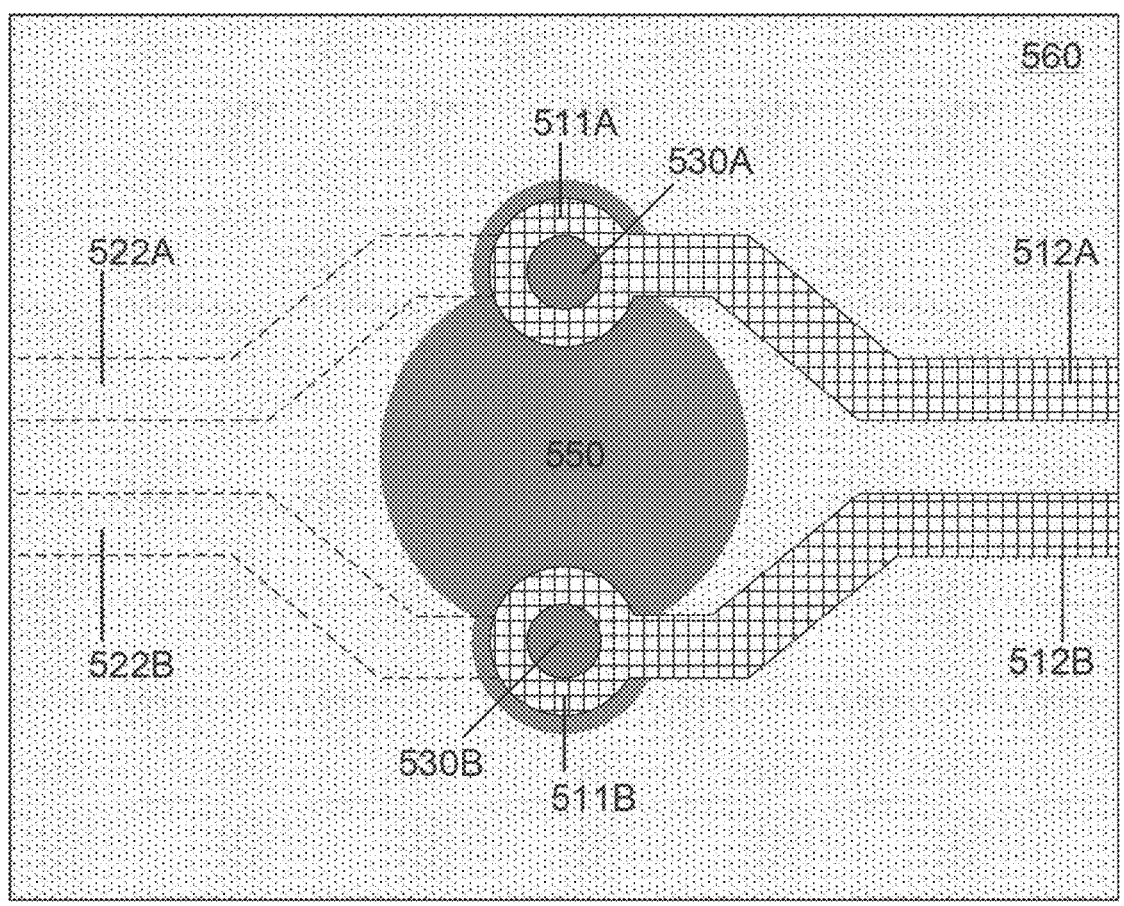
FIG. 7 illustrates a projective view of an inter-surface junction of a substrate according to some embodiments of the instant disclosure.

FIG. 7 illustrates a projective view of an inter-surface junction of a substrate according to some embodiments of the instant disclosure. The inter-surface junction comprises a pair of terminal portions 511A and 511B arranged adjacent to each other, and a pair of linear portions 512A and 512B correspondingly extending away from the pair of terminal portions 511A and 511B and arranged to be linearly abreast each other. In some embodiments, the pair of terminal portions 511A and 511B and the pair of linear portions 512A and 512B are formed on the first surface of a substrate. In some embodiments, a buffer section may be arranged between the linear portions 512A and 512B and the terminal portions 511A and 511B. The buffer section defines a gradually increasing separation from the linear portions 512A and 512B to the terminal portions 511A and 511B.

In some embodiments, the inter-surface junction further comprises another pair of terminal portions (not shown in FIG. 7) formed on the second surface of the substrate and arranged adjacent to each other, and a pair of linear portions 522A and 522B correspondingly extending away from the pair of terminal portions on the second surface and arranged to be linearly abreast each other. In some embodiments, a buffer section may be arranged between the linear portions 522A and 522B and the terminal portions on the second surface. The buffer section defines a gradually increasing separation from the linear portions 522A and 522B to the terminal portions on the second surface.

In some embodiments, a pair of complementary conductive vias 530A and 530B are formed correspondingly in the central area of the pair of terminal portions 511A and 511B. The conductive vias 530A and 530B enable signal communication between the first surface and the second surface. In an exemplary embodiment, a diameter of projective profile of the conductive vias 530A and 530B ranges between 10 mil to 12 mil. Though, the diameter of the conductive vias 530A and 530B may vary according to the design rule used in forming the conductive pattern. In some embodiments, the dimeter of the conductive vias 530A and 530B may be reduced when terminal portions 511A and 511B having a larger profile area is needed.

In some embodiments, a solder mask material 560 disposed on at least one surface of the substrate. The terminal portions 511A and 511B are exposed through the solder mask layer 560. Further, the solder mask layer 560 exposes a dielectric region 550 of the substrate. In some embodiments, the dielectric region 550 have a rounded annular profile. A portion of the annular profile conforms to the profile of the terminal portions 511A and 511B.

Figure 8:
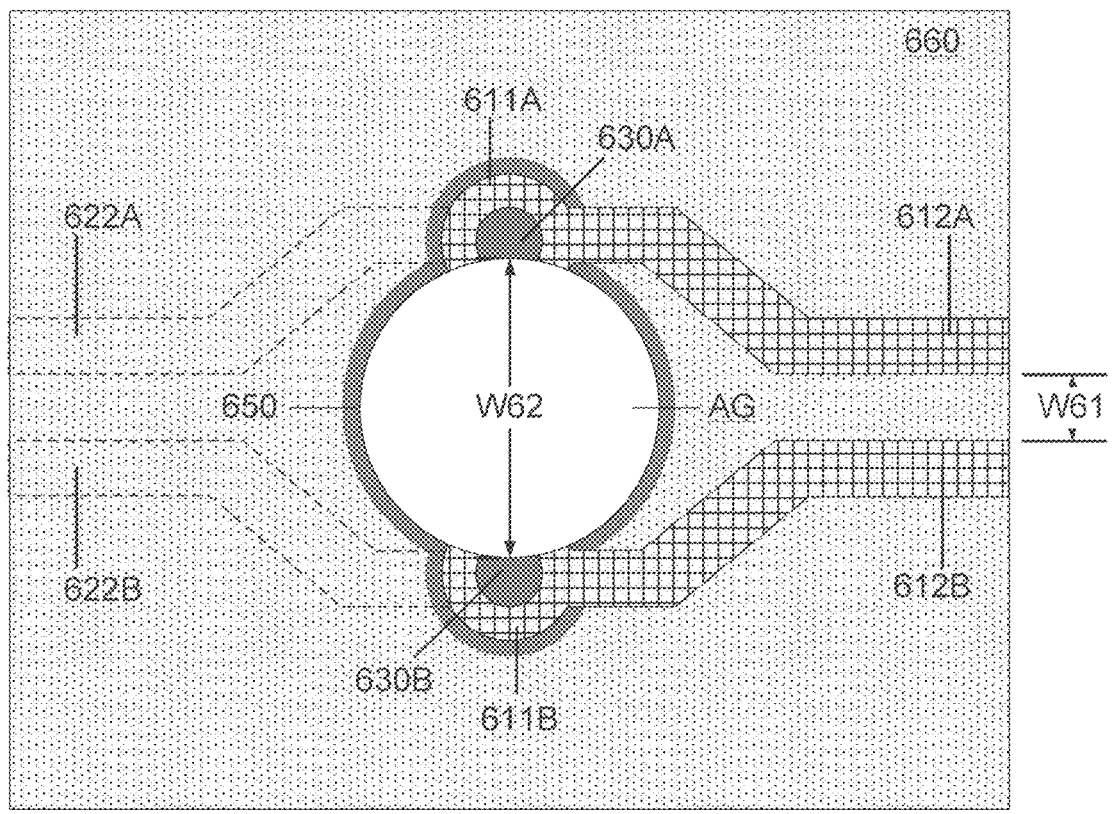
FIG. 8 illustrates a projective view of an inter-surface junction of a substrate according to some embodiments of the instant disclosure.

FIG. 8 illustrates a projective view of an inter-surface junction of a substrate according to some embodiments of the instant disclosure. The inter-surface junction comprises a pair of terminal portions 611A and 611B arranged adjacent to each other, and a pair of linear portions 612A and 612B correspondingly extending away from the pair of terminal portions 611A and 611B and arranged to be linearly abreast each other. A first separation is formed between the linear portions 612A and 612B. The first separation have a width W61. In some embodiments, the pair of terminal portions 611A and 611B and the pair of linear portions 612A and 612B are formed on the first surface of a substrate. In some embodiments, a buffer section may be arranged between the linear portions 612A and 612B and the terminal portions 611A and 611B. The buffer section defines a gradually increasing separation from the linear portions 612A and 612B to the terminal portions 611A and 611B.

In some embodiments, the inter-surface junction further comprises another pair of terminal portions (not shown in FIG. 8) formed on the second surface of the substrate and arranged adjacent to each other, and a pair of linear portions 622A and 622B correspondingly extending away from the pair of terminal portions on the second surface and arranged to be linearly abreast each other. In some embodiments, a buffer section may be arranged between the linear portions 622A and 622B and the terminal portions on the second surface. The buffer section defines a gradually increasing separation from the linear portions 622A and 622B to the terminal portions on the second surface.

In some embodiments, a pair of complementary conductive vias 630A and 630B are formed correspondingly in the central area of the pair of terminal portions 611A and 611B. The conductive vias 630A and 630B enable signal communication between the first surface and the second surface. In an exemplary embodiment, a diameter of projective profile of the conductive vias 630A and 630B ranges between 10 mil to 12 mil. Though, the diameter of the conductive vias 630A and 630B may vary according to the design rule used in forming the conductive pattern. In some embodiments, the dimeter of the conductive vias 630A and 630B may be reduced when terminal portions 611A and 611B having a larger profile area is needed.

In some embodiments, a solder mask material 660 disposed on at least one surface of the substrate. The terminal portions 611A and 611B are exposed through the solder mask layer 660. Further, the solder mask layer 660 exposes a dielectric region 650 of the substrate. In some embodiments, the dielectric region 650 have a rounded annular profile. A portion of the annular profile conforms to the profile of the terminal portions 611A and 611B.

In some embodiments, a gap AG is formed between the terminal portions 611A and 611B. In some embodiments, the gap AG defines a substantially circular profile. The dielectric region 650 of the substrate further conforms to the profile of the gap AG.

A second separation is formed between the terminal portions 611A and 611B by the gap AG. The second separation have a width W62. In some embodiments, the width W62 of the second separation is greater than the width W61 of the first separation.

In some embodiments, the gap AG forms complementary notches between the terminal portions 611A and 611B. The width W62 of the gap AG between the complementary notches ranges between 30 mil to 40 mil. In some embodiments, the width W62 is 30 mil. Further, the notches on the formed on terminal portions 611A and 611B by the gap AG are mirror symmetrical to each other.

Figure 9:
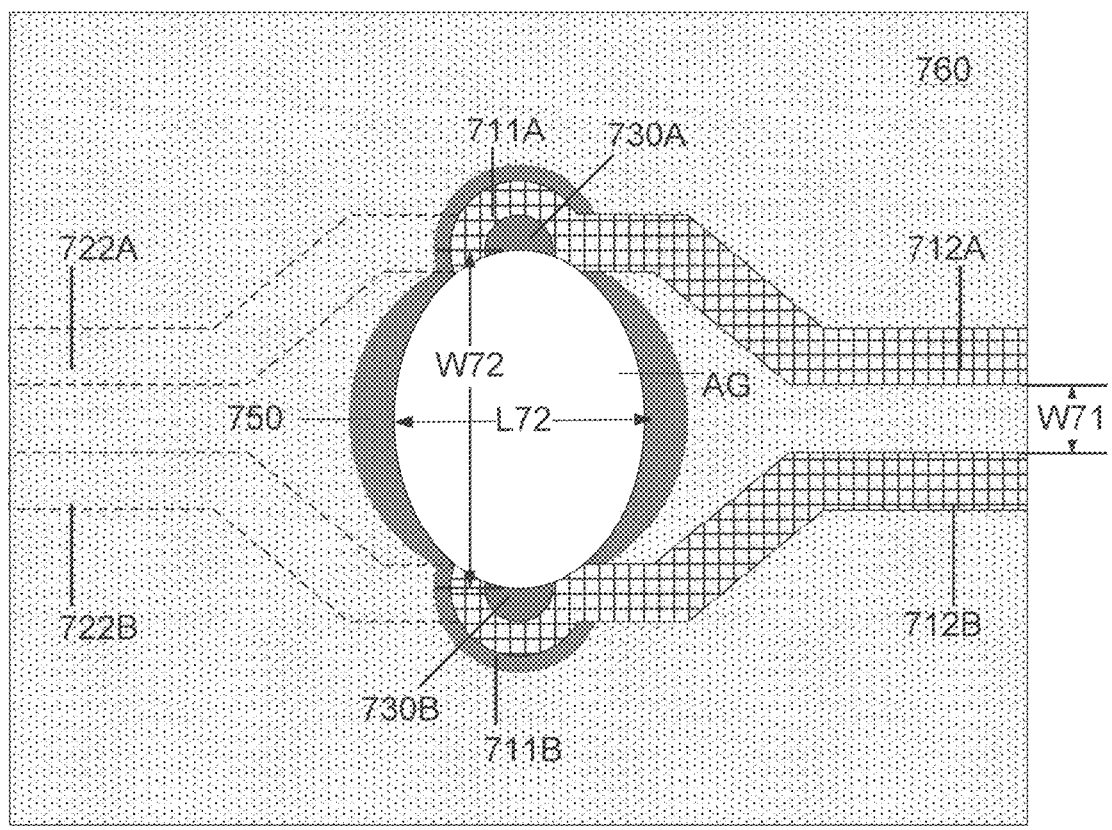
FIG. 9 illustrates a projective view of an inter-surface junction of a substrate according to some embodiments of the instant disclosure.

FIG. 9 illustrates a projective view of an inter-surface junction of a substrate according to some embodiments of the instant disclosure. The inter-surface junction comprises a pair of terminal portions 711A and 711B arranged adjacent to each other, and a pair of linear portions 712A and 712B correspondingly extending away from the pair of terminal portions 711A and 711B and arranged to be linearly abreast each other. A first separation is formed between the linear portions 712A and 712B. The first separation have a width W71. In some embodiments, the pair of terminal portions 711A and 711B and the pair of linear portions 712A and 712B are formed on the first surface of a substrate. In some embodiments, a buffer section may be arranged between the linear portions 712A and 712B and the terminal portions 711A and 711B. The buffer section defines a gradually increasing separation from the linear portions 712A and 712B to the terminal portions 711A and 711B.

In some embodiments, the inter-surface junction further comprises another pair of terminal portions (not shown in FIG. 9) formed on the second surface of the substrate and arranged adjacent to each other, and a pair of linear portions 722A and 722B correspondingly extending away from the pair of terminal portions on the second surface and arranged to be linearly abreast each other. In some embodiments, a buffer section may be arranged between the linear portions 722A and 722B and the terminal portions on the second surface. The buffer section defines a gradually increasing separation from the linear portions 722A and 722B to the terminal portions on the second surface.

In some embodiments, a pair of complementary conductive vias 730A and 730B are formed correspondingly in the central area of the pair of terminal portions 711A and 711B. The conductive vias 730A and 730B enable signal communication between the first surface and the second surface. In an exemplary embodiment, a diameter of projective profile of the conductive vias 730A and 730B ranges between 10 mil to 12 mil. Though, the diameter of the conductive vias 730A and 730B may vary according to the design rule used in forming the conductive pattern. In some embodiments, the dimeter of the conductive vias 730A and 730B may be reduced when terminal portions 711A and 711B having a larger profile area is needed.

In some embodiments, a solder mask material 760 disposed on at least one surface of the substrate. The terminal portions 711A and 711B are exposed through the solder mask layer 760. Further, the solder mask layer 760 exposes a dielectric region 750 of the substrate. In some embodiments, the dielectric region 750 have a rounded annular profile. A portion of the annular profile conforms to the profile of the terminal portions 711A and 711B.

In some embodiments, a gap AG is formed between the terminal portions 711A and 711B. In some embodiments, the gap AG defines a substantially elliptical profile. The dielectric region 650 of the substrate further conforms to the profile of the gap AG.

A second separation is formed between the terminal portions 711A and 711B by the gap AG. The second separation have a width W72. In some embodiments, the width W72 of the second separation is greater than the width W71 of the first separation.

In some embodiments, the gap AG forms complementary notches between the terminal portions 711A and 711B. The width W72 of the gap AG between the complementary notches ranges between 30 mil to 40 mil. In some embodiments, the width W72 is 40 mil. Further, the notches on the formed on terminal portions 711A and 711B by the gap AG are mirror symmetrical to each other. When a width W72 of a gap AG is increased, the area of the terminal portions 711A and 711B are decreased. In this way, the insertion loss during operation decreases as the width W72 of the gap AG increases. In some embodiments, the width W72 to length L72 ratio of the gap AG may be 3:8. In some embodiments, when the length L72 of the gap AG is 32 mil, the width W72 of the gap AG is 12 mil.

Figure 10:
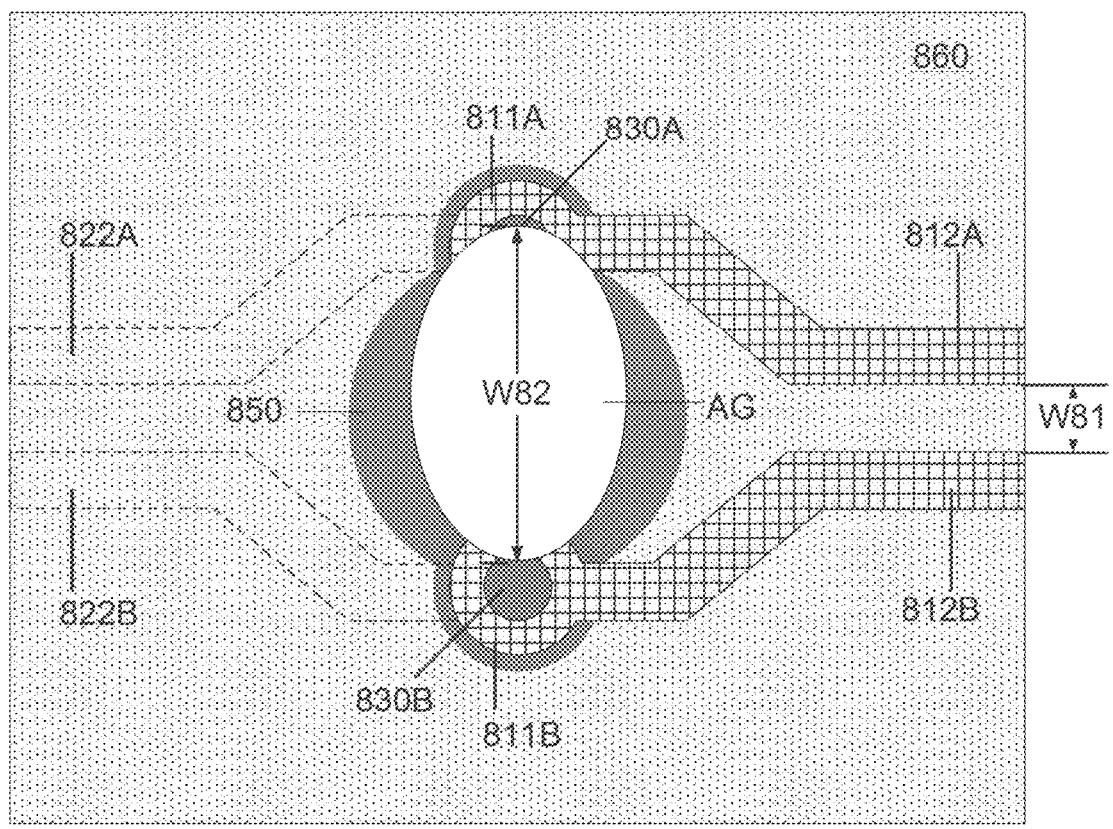
FIG. 10 illustrates a projective view of an inter-surface junction of a substrate according to some embodiments of the instant disclosure.

FIG. 10 illustrates a projective view of an inter-surface junction of a substrate according to some embodiments of the instant disclosure. The inter-surface junction comprises a pair of terminal portions 811A and 811B arranged adjacent to each other, and a pair of linear portions 812A and 812B correspondingly extending away from the pair of terminal portions 811A and 811B and arranged to be linearly abreast each other. A first separation is formed between the linear portions 812A and 812B. The first separation have a width W81. In some embodiments, the pair of terminal portions 811A and 811B and the pair of linear portions 812A and 812B are formed on the first surface of a substrate. In some embodiments, a buffer section may be arranged between the linear portions 812A and 812B and the terminal portions 811A and 811B. The buffer section defines a gradually increasing separation from the linear portions 812A and 812B to the terminal portions 811A and 811B.

In some embodiments, the inter-surface junction further comprises another pair of terminal portions (not shown in FIG. 10) formed on the second surface of the substrate and arranged adjacent to each other, and a pair of linear portions 822A and 822B correspondingly extending away from the pair of terminal portions on the second surface and arranged to be linearly abreast each other. In some embodiments, a buffer section may be arranged between the linear portions 822A and 822B and the terminal portions on the second surface. The buffer section defines a gradually increasing separation from the linear portions 822A and 822B to the terminal portions on the second surface.

In some embodiments, a pair of complementary conductive vias 830A and 830B are formed correspondingly in the central area of the pair of terminal portions 811A and 811B. The conductive vias 830A and 830B enable signal communication between the first surface and the second surface. In some embodiments, the diameter of the terminal portions 811A and 811B is 20 mil. In an exemplary embodiment, a diameter of projective profile of the conductive vias 830A and 830B ranges between 10 mil to 12 mil. Though, the diameter of the conductive vias 830A and 830B and the terminal portions 811A and 811B may vary according to the design rule used in forming the conductive pattern. In some embodiments, the diameter of the conductive vias 830A and 830B may be reduced when terminal portions 811A and 811B having a larger profile area is needed. In some other embodiments, the diameter of the terminal portions 811A and 811B may be increased when conductive vias 830A and 830B having a larger projective profile is needed.

In some embodiments, a solder mask material 860 disposed on at least one surface of the substrate. The terminal portions 811A and 811B are exposed through the solder mask layer 860. Further, the solder mask layer 860 exposes a dielectric region 850 of the substrate. In some embodiments, the dielectric region 850 have a rounded annular profile. A portion of the annular profile conforms to the profile of the terminal portions 811A and 811B.

In some embodiments, a gap AG is formed between the terminal portions 811A and 711B. In some embodiments, the gap AG defines a substantially elliptical profile. The dielectric region 650 of the substrate further conforms to the profile of the gap AG.

A second separation is formed between the terminal portions 811A and 811B by the gap AG. The second separation have a width W82. In some embodiments, the width W82 of the second separation is greater than the width W81 of the first separation.

In some embodiments, the gap AG forms complementary notches between the terminal portions 811A and 811B. The width W82 of the gap AG between the complementary notches ranges between 30 mil to 40 mil. In some embodiments, the width W82 is 35 mil. Further, the notches on the formed on terminal portions 811A and 811B by the gap AG are non-symmetrical. In some embodiments, the area of one of the terminal portions 811A and 811B is greater than the other depending on the need of the operation. In this way, the insertion loss during operation decreases as the width W82 of the gap increases.

Figure 11:
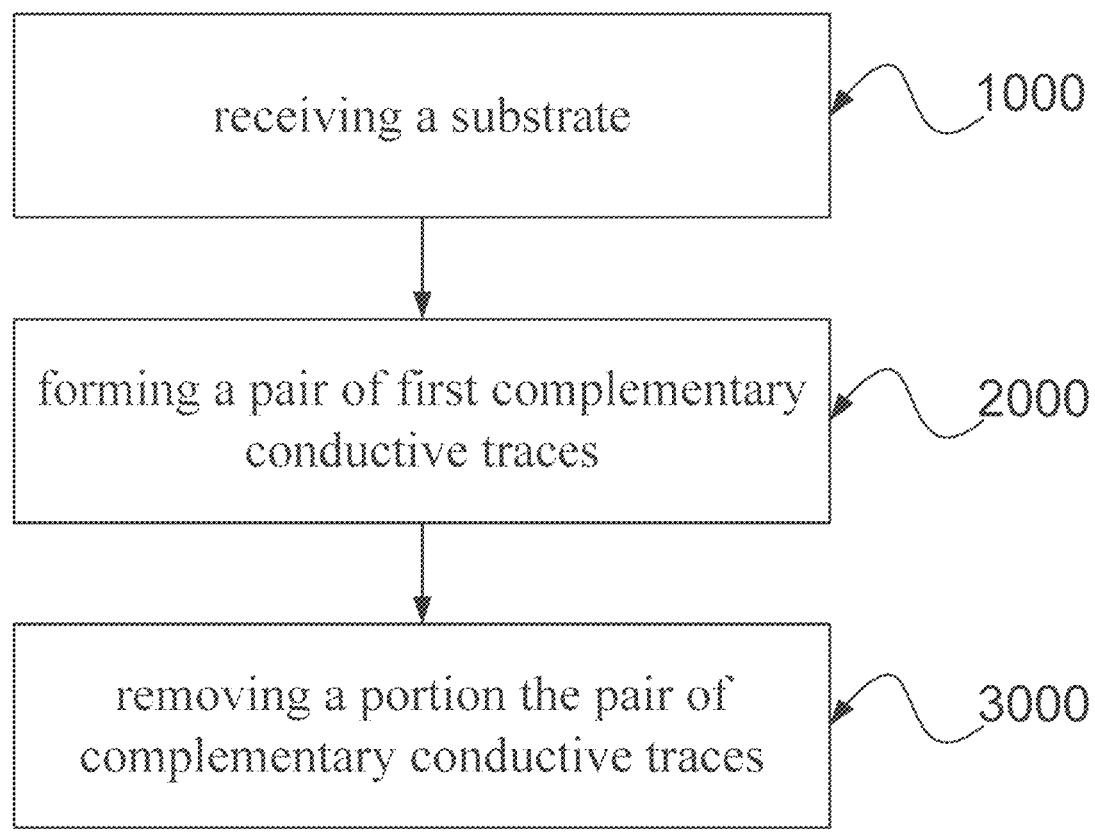
FIG. 11 illustrates a flowchart of a method of forming an inter-surface junction of a substrate according to some embodiments of the instant disclosure.

FIG. 11 illustrates a flowchart of a method of forming an inter-surface junction of a substrate according to some embodiments of the instant disclosure. The method of forming an inter-surface junction of a substrate includes receiving a substrate, forming a pair of first complementary conductive traces, and removing a portion the pair of complementary conductive traces. The substrate has a first surface and an opposite second surface. The first complementary conductive traces are formed on the first surface. Each of the first traces comprises a linear portion and a terminal portion. A portion of the terminal portions of the first traces are removed to form a pair of complementary notches facing toward each other on the terminal portions of the first traces.

When the terminal portions of the first traces are initially formed on the substrate, the terminal portions each have an annular profile. After removing a portion of the terminal portions of the first traces, the terminal portions each have a circular arc profile. The notches on the terminal portions are complementary to each other. And, a gap is formed between the notches. The gap is used to decrease the insertion loss during operation. Thus, the propagation speed is increased, and the threshold trace length is increased.

In some embodiments, a pair of second complementary conductive traces are formed on the second surface of the substrate. Each of the second complementary conductive traces comprises a linear portion and a terminal portion. A portion of the terminal portions of the second traces are removed to form a pair of complementary notches facing toward each other on the terminal portions of the second traces.

In some embodiments, the terminal portions on the first surface projectively overlaps the terminal portions on the second surface. the terminal portions of the conductive traces on the first and the second surfaces of the substrate substantially align to each other. On the other hand, the linear portions on the first surface extends in an opposite direction of the linear portions on the second surface as shown in FIGS. 7-10.

In some embodiments, a pair of conductive vias are formed adjacent to each other to correspondingly electrically couple the terminal portions on the first surface to the terminal portions on the second surface. In some embodiments, the conductive vias before forming the notches on the terminal portions of the first surface and the terminal portions of the second surface.

In some embodiments, the conductive vias are formed by forming a through hole on the central area of the terminal portions and plating the wall of the through hole with a layer of conductive material to electrically connect the terminal portions formed within the different layers of the substrate. In an exemplary embodiment shown in FIG. 2, the terminal portions on the first surface is electrically connected to the terminal portions on the second surface through the conductive vias.

Further, to increase the structural integrity of the conductive vias, a filling is further disposed within the conductive vias. The material of the filling includes at least one of dielectric material and conductive epoxy material.

In some other embodiments, the conductive vias are formed by stacking a plurality of sectional vias on top of each other. The sectional vias are formed on plurality of dielectric layers stacked together to form the substrate.

When forming the gap between the pair of complementary traces, drilling process may be utilized. Drilling through the substrate between the terminal portions removes a portion of the terminal portions to form pairs of circular arc profiles on both the first surface and the second surface of the substrate. A pair of complementary notches facing toward each other is defined on the first surface and the second surface. In some embodiments, the width of the hole formed by the drill is at 30 mil. To increase the width of the gap, the number of times the drilling process is increased. In some embodiments, when the conductive vias are plugged vias or filled vias, the through holes of the conductive vias may be formed in the same process as forming the gap. In some embodiments, the through holes of the conductive vias and the gap are formed sequentially. In some other embodiments, the through holes of the conductive vias and the gap are formed simultaneously.

In some embodiments, to form the gap in FIG. 8, one time drilling is utilized. In some other embodiments, to form the gap in FIG. 10, two times drilling is utilized. In some other embodiments, to form the gap in FIG. 9, three times drilling is utilized. The increase in the air gap separation of between the complementary traces decreases the insertion loss during operation.

In some embodiments, after the gap is formed between the complementary traces, a layer of dielectric material is left between the pair of complementary conductive vias as shown in FIG. 4. In some other embodiments, after the gap is formed between the complementary traces, a portion of the pair of complementary conductive vias are exposed through the gap as shown in FIG. 5. Further, after the gap is formed between the complementary traces, a portion of the pair of complementary conductive vias are removed as shown in FIG. 6.

In some embodiments, a solder mask layer is formed on a surface of the substrate. A dielectric region defining the inter-surface junction is exposed through the solder mask layer. The dielectric region has an annular profile conforming to the terminal portions of the complementary traces and the gap between the terminal portions.

Accordingly, one aspect of the instant disclosure provides a conductive pattern over a substrate that comprises a pair of complementary conductive traces, each comprising a linear portion and a terminal portion. The linear portions of the pair of traces extend linearly abreast each other at a first separation. The terminal portions of the pair of traces are arranged adjacent to each other. The terminal portions of the pair of traces comprises a pair of circular arc profile with a pair of complementary notches facing toward each other. A gap between the complementary notches of the terminal portions is wider than the first separation.

In some embodiments, the pattern comprises a dielectric region having a rounded annular profile. The terminal portions of the pair of traces are arranged in the dielectric region.

In some embodiments, the annular profile of the dielectric region partially conforms to the gap between the complementary notches of the pair of terminal portions, and defines a substantially elliptical air gap.

In some embodiments, the complementary notches are substantially mirror symmetrical.

In some embodiments, a width of the gap between the pair of complementary notches ranges between 30 mil to 40 mil.

In some embodiments, the complementary conductive traces and the dielectric region are exposed from a solder mask layer disposed over the substrate.

In some embodiments, the complementary conductive traces further comprise an buffer section arranged between the linear portions and the terminal portions. The buffer section defines a gradually increasing separation from the linear portions toward the terminal portions.

Accordingly, another aspect of the instant disclosure provides a conductive structure that comprises a substrate having a first surface and an opposite second surface, an inter-surface junction having an air gap formed in the substrate, a pair of first complementary conductive traces arranged on the first surface of the substrate, and a pair of second complementary conductive traces arranged on the second surface of the substrate. The air gap enabling access between the first surface and the second surface. Each of the first complementary conductive traces comprising a linear portion and a terminal portion. The terminal portions of the pair of first traces comprise a pair of circular arc profile with a pair of complementary notches facing toward the air gap. Each of second complementary conductive traces comprising a linear portion and a terminal portion. The terminal portions of the pair of second traces comprise a pair of circular arc profile with a pair of complementary notches facing toward the air gap.

In some embodiments, the air gap exposes conductive vias that enable signal communication between the first surface and the second surface at the complementary notches.

In some embodiments, the terminal portions of the pair of first traces and the terminal portions of the pair of second traces are electrically connected through the conductive vias exposed from the air gap.

In some embodiments, the pattern further comprises a dielectric region having a rounded annular profile. The terminal portions of the pair of first trances are arranged in the dielectric region.

In some embodiments, the annular profile of the dielectric region partially conforms to the sectional profile of the air gap between the complementary notches of the pair of terminal portions of the first traces, and defines a substantially elliptical air gap.

In some embodiments, the complementary notches are substantially mirror symmetrical.

In some embodiments, a width of the air gap ranges between 30 mil to 40 mil.

In some embodiments, the complementary conductive traces and the dielectric region are exposed from solder mask material disposed over the substrate. The side wall that defines the air gap is free from solder mask material.

In some embodiments, at least one of the first or the second complementary conductive traces further comprise an buffer section arranged between the linear portions and the terminal portions. The buffer section defines a gradually increasing separation from the linear portions toward the air gap.

Accordingly, another aspect of the instant disclosure provides a method of forming a circuit board that comprises receiving a substrate, the substrate having a first surface and an opposite second surface; forming a pair of complementary conductive traces on the first surface, each comprising a linear portion and a terminal portion having an annular profile; and removing a portion of the terminal portions to form a pair of circular arc profile with a pair of complementary notches facing toward each other.

In some embodiments, the method further comprises forming another pair of complementary conductive traces on the second surface, each comprising a linear portion and a terminal portion having an annular profile. The terminal portions of the conductive traces on the first and the second surfaces of the substrate substantially align to each other. The removing of a portion of the terminal portions comprising drilling through the substrate between the terminal portions to form pairs of circular arc profiles on both the first and the second surfaces of the substrate, each defining a pair of complementary notches facing toward each other.

In some embodiments, the method further comprises forming conductive vias electrically coupling the pair of terminal portions on the first surface and the pair of terminal portions on the second surface. The conductive vias are formed before forming the notches on the first surface and the second surface.

In some embodiments, the drilling though the substrate between the terminal portions forms an air gap that exposes conductive vias that enable signal communication between the first surface and the second surface at the complementary notches.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A conductive pattern configured to be applied over a substrate, comprising:
   a dielectric region; and
   a pair of complementary conductive traces, each comprising a linear portion and a terminal portion,
   wherein the linear portions of the pair of traces extend linearly abreast each other at a first separation,
   wherein the terminal portions of the pair of traces are arranged adjacent to each other, and the terminal portions of the pair of complementary conductive traces are arranged in the dielectric region,
   wherein the terminal portions of the pair of traces comprises a pair of circular arc profiles with a pair of complementary notches facing toward each other,
   wherein a gap between the complementary notches of the terminal portions is wider than the first separation,
   wherein the pair of complementary conductive traces and the dielectric region are exposed from a solder mask layer disposed over the substrate.

2. The conductive pattern of claim 1,
   wherein the dielectric region has a annular profile.

3. The conductive pattern of claim 2,
   wherein the annular profile of the dielectric region partially conforms to the gap between the complementary notches of the pair of terminal portions, and defines a substantially elliptical air gap.

4. The conductive pattern of claim 1,
   wherein the complementary notches are substantially mirror symmetrical.

5. The conductive pattern of claim 1,
   wherein a width of the gap between the pair of complementary notches ranges between about 30 mil to about 40 mil.

6. The conductive pattern of claim 1,
   wherein the pair of complementary conductive traces further comprise a buffer section arranged between the linear portions and the terminal portions,
   wherein the buffer section defines a gradually increasing separation from the linear portions toward the terminal portions.

7. A conductive structure comprising:
   a substrate having a first surface and an opposite second surface;
   an inter-surface junction having an air gap formed in the substrate, the air gap enabling access between the first surface and the second surface;
   a pair of first complementary conductive traces arranged on the first surface of the substrate, each comprising a linear portion and a terminal portion,
   wherein the terminal portions of the pair of first complementary conductive traces comprise a pair of circular arc profiles with a pair of complementary notches facing toward the air gap; and
   a pair of second complementary conductive traces arranged on the second surface of the substrate, each comprising a linear portion and a terminal portion,
   wherein the terminal portions of the pair of second complementary conductive traces comprise a pair of circular arc profile with a pair of complementary notches facing toward the air gap;
   a dielectric region, wherein the terminal portions of the pair of first complementary conductive trances are arranged in the dielectric region,
   wherein the pair of first complementary conductive traces, the pair of second complementary conductive traces, and the dielectric region are exposed from a solder mask layer disposed over the substrate.

8. The conductive structure of claim 7,
   wherein the air gap exposes conductive vias that enable signal communication between the first surface and the second surface at the complementary notches.

9. The conductive structure of claim 8,
   wherein the terminal portions of the pair of first complementary conductive traces and the terminal portions of the pair of second complementary conductive traces are electrically connected through the conductive vias exposed from the air gap.

10. The conductive structure of claim 7,
    wherein the dielectric region has a annular profile.

11. The conductive structure of claim 10,
    wherein the annular profile of the dielectric region partially conforms to the sectional profile of the air gap between the complementary notches of the pair of terminal portions of the first complementary conductive traces, and defines a substantially elliptical air gap.

12. The conductive structure of claim 7,
    wherein the complementary notches are substantially mirror symmetrical.

13. The conductive structure of claim 7,
    wherein a width of the air gap ranges between 30 mil to 40 mil.

14. The conductive structure of claim 7,
    wherein a side wall that defines the air gap is free from the solder mask layer.

15. The conductive structure of claim 7,
    wherein at least one of the pair of first complementary conductive traces and the pair of second complementary conductive traces further comprise a buffer section arranged between the linear portions and the terminal portions,
    wherein the buffer section defines a gradually increasing separation from the linear portions toward the air gap.

16. A method of forming a circuit board, comprising:

receiving a substrate, the substrate having a first surface and an opposite second surface;

forming a pair of complementary conductive traces and a dielectric region on the first surface, each comprising a linear portion and a terminal portion having an annular profile; and removing a portion of the terminal portions to form a pair of circular arc profiles with a pair of complementary notches facing toward each other;

wherein the terminal portions of the pair of complementary conductive traces are arranged in the dielectric region, and the pair of complementary conductive traces and the dielectric region are exposed from a solder mask layer disposed over the substrate.

17. The method of claim 16, further comprising:

forming another pair of complementary conductive traces on the second surface, each comprising a linear portion and a terminal portion having an annular profile;

wherein the terminal portions of the conductive traces on the first and the second surfaces of the substrate substantially align to each other; and wherein the removing of a portion of the terminal portions comprising drilling through the substrate between the terminal portions to form pairs of circular arc profiles on both the first and the second surfaces of the substrate, each defining a pair of complementary notches facing toward each other.

18. The method of claim 17, further comprising:

forming conductive vias electrically coupling the pair of terminal portions on the first surface and the pair of terminal portions on the second surface;

wherein the conductive vias are formed before forming the notches on the first surface and the second surface.

19. The method of claim 17, wherein the drilling though the substrate between the terminal portions forms an air gap that exposes conductive vias that enable signal communication between the first surface and the second surface at the complementary notches.

\* \* \* \* \*